US012614606B2

(12) United States Patent
Noh et al.

(10) Patent No.: US 12,614,606 B2
(45) Date of Patent: Apr. 28, 2026

(54) SEMICONDUCTOR DEVICE AND MEMORY DEVICE INCLUDING SAMPLING CIRCUIT

(71) Applicant: SK hynix Inc., Gyeonggi-do (KR)

(72) Inventors: Jun Seok Noh, Gyeonggi-do (KR);
Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 115 days.

(21) Appl. No.: 18/810,552

(22) Filed: Aug. 21, 2024

(65) Prior Publication Data

US 2025/0322900 A1 Oct. 16, 2025

(30) Foreign Application Priority Data

Apr. 12, 2024 (KR) ........................ 10-2024-0049253

(51) Int. Cl.
G11C 29/00 (2006.01)
(52) U.S. Cl.
CPC ............ G11C 29/783 (2013.01); G11C 29/76 (2013.01); G11C 29/789 (2013.01)
(58) Field of Classification Search
CPC ..... G11C 29/783; G11C 29/76; G11C 29/789; G11C 11/408; G11C 11/40611; G06F 3/0659; G06F 7/588
See application file for complete search history.

(56) References Cited

U.S. PATENT DOCUMENTS

| | | | |
|---|---|---|---|
| 11,749,371 B2 * | 9/2023 | Kim | .................... G11C 11/4078 |
| | | | 714/719 |
| 2020/0176050 A1 | 6/2020 | Ito et al. | |
| 2022/0189533 A1 * | 6/2022 | Kim | ................. G11C 11/40603 |

FOREIGN PATENT DOCUMENTS

KR 10-2023-0068232 A 5/2023

* cited by examiner

*Primary Examiner* — Xiaochun L Chen
(74) *Attorney, Agent, or Firm* — IP & T GROUP LLP

(57) ABSTRACT

A semiconductor device includes a random number generation circuit configured to generate a plurality of random signals according to a sampling signal; an active counter configured to count a number of inputs of an active command during a sampling period defined by the sampling signal to generate an active count signal; a replacement control circuit configured to compare the active count signal with each of the plurality of random signals to generate a replacement control signal; and a sampling latch configured to replace a sampling address with an input address according to the replacement control signal, and output the sampling address according to the sampling signal.

20 Claims, 16 Drawing Sheets

Figure 8:
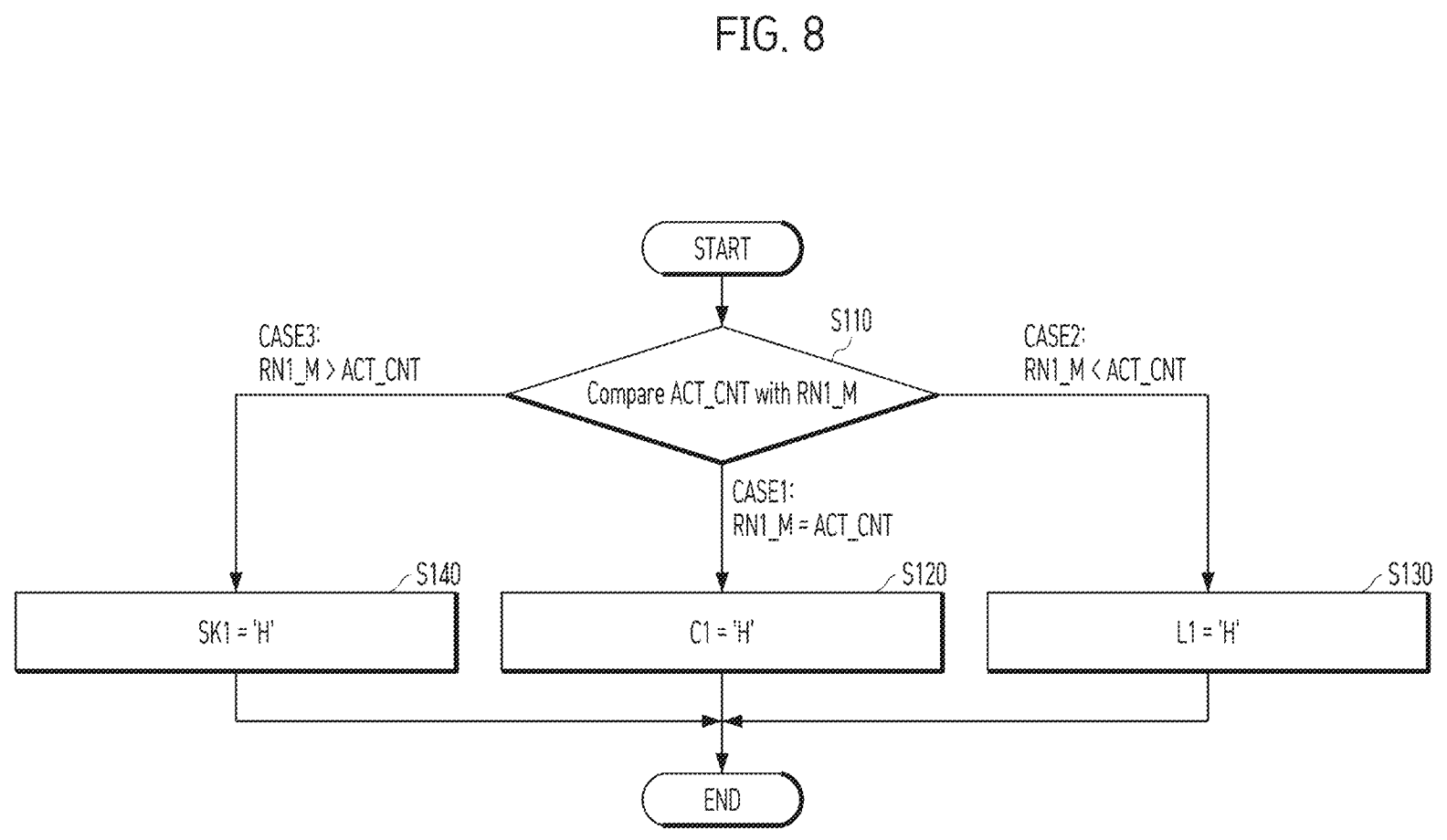

START

S110

Compare ACT_CNT with RN1_M

CASE2:
RN1_M < ACT_CNT

CASE1:
RN1_M = ACT_CNT

CASE3:
RN1_M > ACT_CNT

L1 = 'H'  S130

C1 = 'H'  S120

SK1 = 'H'  S140

END

FIG. 9A

| | | | | | | | | | | |
|---|---|---|---|---|---|---|---|---|---|---|
| ACT_CNT | 0 | 0 | 0 | 0 | 0 | 0 | 1 | 0 | 1 | 0 |
| MASK | 0 | 0 | 0 | 0 | 0 | 0 | 1 | 1 | 1 | 1 |
| RN1 | 0 | 1 | 1 | 0 | 0 | 1 | 1 | 0 | 0 | 0 |
| RN2 | 0 | 0 | 1 | 1 | 0 | 1 | 1 | 1 | 1 | 0 |
| RN3 | 0 | 0 | 0 | 0 | 1 | 0 | 1 | 0 | 1 | 0 |

~ Match

FIG. 9B

| | C# | L# | SK# |
|---|---|---|---|
| 234_1 | L | H | L |
| 234_2 | L | L | H |
| 234_3 | H | L | L |

SEMICONDUCTOR DEVICE AND MEMORY DEVICE INCLUDING SAMPLING CIRCUIT

CROSS-REFERENCE TO RELATED APPLICATION

The present application claims the benefit of Korean Patent Application No. 10-2024-0049253, filed on Apr. 12, 2024, which is incorporated herein by reference in its entirety.

BACKGROUND

1. Field

Various embodiments of the present disclosure relate to a semiconductor design technology, and more particularly, to a semiconductor device and a memory device including a sampling circuit that randomly samples input signals.

2. Description of the Related Art

Recently, in addition to a normal refresh operation, an additional refresh operation which will be, hereinafter, referred to as a 'target refresh operation', is performed on the memory cells coupled to a specific word line that is likely to lose data due to row hammering phenomenon. The row hammering phenomenon refers to a phenomenon in which data of memory cells coupled to a specific word line or adjacent word lines disposed adjacent to the specific word line are damaged due to a high number of activations of the specific word line. In order to prevent the row hammering phenomenon, a target refresh operation is performed on a word line that is activated more than a predetermined number of times, and adjacent word lines disposed adjacent to the word line.

In the target refresh operation, word lines on which the target refresh operation is to be performed may be selected by randomly sampling addresses based on probability. Accordingly, research on a sampling circuit for randomly sampling addresses has been conducted.

SUMMARY

Embodiments of the present disclosure are directed to a semiconductor device and a memory device including a sampling circuit capable of randomly sampling addresses.

According to an embodiment of the present disclosure, a semiconductor device includes a random number generation circuit configured to generate a plurality of random signals according to a sampling signal; an active counter configured to count a number of inputs of an active command during a sampling period defined by the sampling signal to generate an active count signal; a replacement control circuit configured to compare the active count signal with each of the plurality of random signals to generate a replacement control signal; and a sampling latch configured to replace a sampling address with an input address according to the replacement control signal, and output the sampling address according to the sampling signal.

According to an embodiment of the present disclosure, a memory device includes a plurality of rows; a sampling control circuit configured to count a number of inputs of an active command during a target refresh period defined by a target refresh signal to generate an active count signal, and compare the active count signal with each of a plurality of random signals to generate a replacement control signal; a sampling latch configured to replace a sampling address with an active address according to the replacement control signal, and output the sampling address as a target address according to the target refresh signal; and a row control circuit configured to refresh at least one row corresponding to the target address, among the plurality of rows, according to the target refresh signal.

Further, according to embodiments of the present disclosure, the semiconductor device can maximize the randomization by sampling addresses with uniform probability during a sampling period.

In addition, according to embodiments of the present disclosure, the semiconductor device can maximize accuracy of address sampling and improve efficiency of a target refresh operation by applying a sampling circuit to a memory device performing a target refresh operation by sampling addresses based on probability. In particular, the memory device can variably respond to the row-hammer situation in which the number of active commands applied during a target refresh period is not constant.

BRIEF DESCRIPTION OF THE DRAWINGS

FIG. 1 is a block diagram illustrating a memory device in accordance with an embodiment of the present disclosure.

FIG. 5 is a block diagram illustrating a replacement control circuit of FIG. 2, in accordance with an embodiment of the present disclosure.

FIGS. 6A and 6B are diagrams for describing a masking circuit of FIG. 5, in accordance with an embodiment of the present disclosure.

FIG. 7 is a block diagram illustrating a first comparator of FIG. 5, in accordance with an embodiment of the present disclosure.

FIG. 8 is a flowchart for describing operations of the first comparator of FIG. 7.

FIGS. 9A and 9B are diagrams for describing operations of the first to third comparators as examples.

FIG. 12 is a circuit diagram illustrating an active latch and a sampling latch of FIG. 1, in accordance with an embodiment of the present disclosure.

FIG. 13 is a block diagram illustrating a memory device according to another embodiment of the present disclosure.

DETAILED DESCRIPTION

Figure 2:
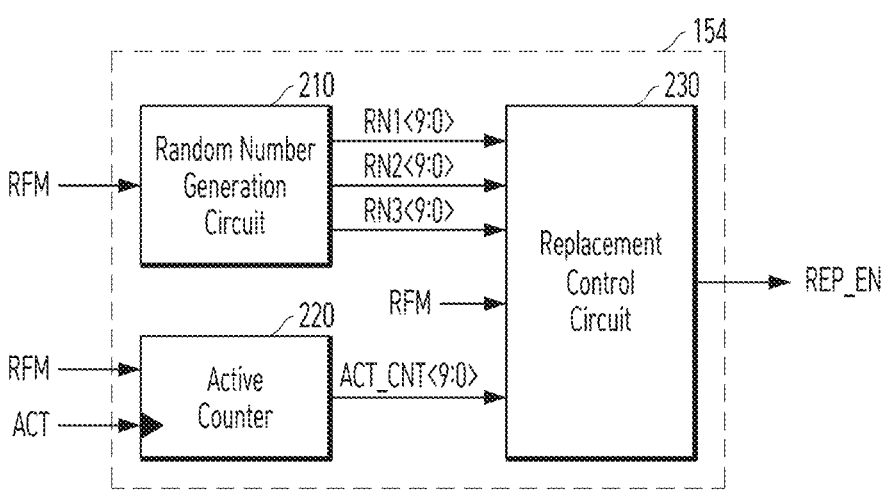
FIG. 2 is a diagram illustrating a sampling control circuit of FIG. 1, in accordance with an embodiment of the present disclosure.

Various embodiments of the present disclosure will be described below in more detail with reference to the accompanying drawings. The embodiments of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout this disclosure, like reference numerals refer to like parts throughout the various figures and embodiments of the present disclosure.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Hereinafter, a memory device is described as a semiconductor device including a sampling circuit. However, the embodiments of the present disclosure are not limited thereto, and may be applied to all semiconductor devices including a sampling circuit for randomly sampling an input address or input signals.

Figure 1:
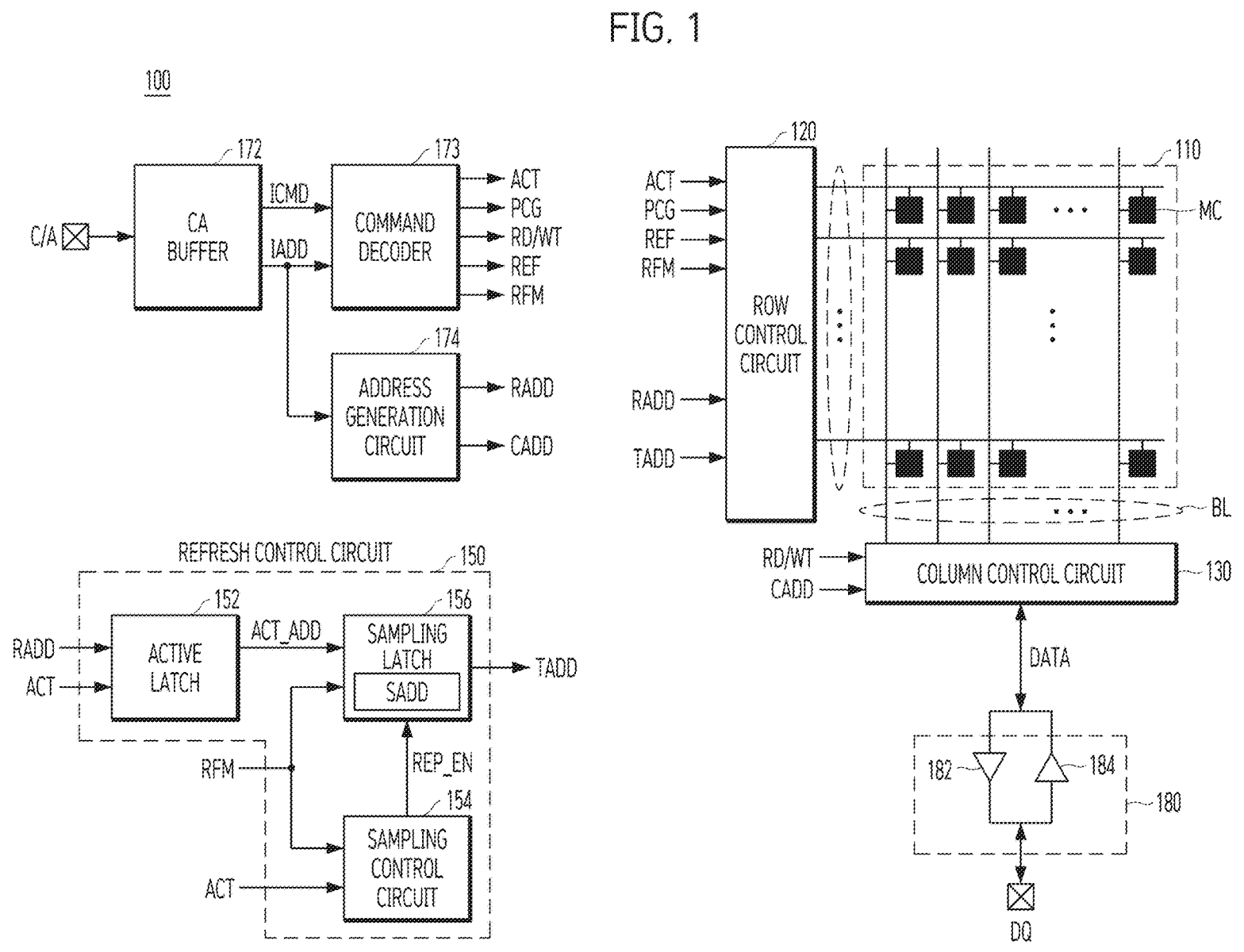

FIG. 1 is a block diagram illustrating a memory device 100 in accordance with an embodiment of the present disclosure.

Referring to FIG. 1, the memory device 100 may include a memory cell region 110, a row control circuit 120, a column control circuit 130, a refresh control circuit 150, a command/address (CA) buffer 172, a command decoder 173, an address generation circuit 174, and a data input/output circuit 180.

The memory cell region 110 may include a plurality of memory cells MC disposed in an array type. The plurality of memory cells MC may be respectively coupled to a plurality of word lines WL (hereinafter referred to as "a plurality of rows WL") and a plurality of bit lines BL (hereinafter referred to as "a plurality of columns BL"). The plurality of rows WL may extend in a first direction (e.g., a row direction) and may be sequentially disposed in a second direction (e.g., a column direction) perpendicular to the first direction. The plurality of columns BL may extend in the column direction and may be sequentially disposed in the row direction. The plurality of memory cells MC may be composed of memory cells that require a refresh operation to secure data retention time. The memory cell region 110 may be composed of at least one bank. The number of banks or the number of memory cells MC may be determined depending on the capacity of the memory device 100.

The CA buffer 172 may receive a command/address signal C/A from an external device (e.g., a memory controller). The CA buffer 172 may buffer the command/address signal C/A to output an internal command ICMD and an internal address IADD.

The command decoder 173 may decode the internal command ICMD output from the CA buffer 172 to generate an active command ACT, a precharge command PCG, a read command RD, and a write command WT. Further, the command decoder 173 may decode the internal command ICMD to generate a normal refresh command REF which is periodically activated, and a refresh management command RFM which is non-periodically activated.

The address generation circuit 174 may classify the internal address IADD received from the CA buffer 172 as a row address RADD and a column address CADD. Depending on an embodiment, the address generation circuit 174 may interpret some bits of the internal address IADD as a row address RADD and interpret the remaining bits as a column address CADD. The address generation circuit 174 may determine the internal address IADD as a row address RADD when an active operation is directed as a result of the decoding by the command decoder 173 and determine the internal address IADD as a column address CADD when a read or write operation is directed by the command decoder 173. The plurality of rows WL may be accessed according to the row address RADD, and the plurality of columns BL may be accessed according to the column address CADD.

The refresh control circuit 150 may latch the row address RADD as an active address ACT_ADD according to the active command ACT, and store the active address ACT_ADD as a sampling address SADD according to a replacement control signal REP_EN. The refresh control circuit 150 may output the sampling address SADD as a target address TADD according to the refresh management command RFM. A target refresh period to be described below may be determined by the refresh management command RFM, and one target refresh period may be defined as a period between adjacent refresh management commands RFM. In the case of a semiconductor device, the target refresh period may be defined as a sampling period, and the refresh management command RFM may be defined as a sampling signal. In case of the semiconductor device, one sampling period may be defined as a period between adjacent sampling signals.

In detail, the refresh control circuit 150 may include an active latch 152, a sampling control circuit 154, and a sampling latch 156.

The active latch 152 may latch and output the internal address IADD as the active address ACT_ADD in response to the active command ACT.

The sampling control circuit 154 may generate an active count signal (ACT_CNT<9:0> of FIG. 2) by counting the number of inputs of the active command ACT during the target refresh period, and may generate the replacement control signal REP_EN by respectively comparing the active count signal ACT_CNT<9:0> with a plurality of random signals (RN1<9:0>, RN2<9:0>, and RN3<9:0> of FIG. 2).

The sampling latch 156 may store one sampling address SADD. The sampling latch 156 may update (i.e., replace) the stored sampling address SADD with the active address ACT_ADD in response to the replacement control signal REP_EN, and output the stored sampling address SADD as the target address TADD in response to the refresh management command RFM. According to an embodiment, the sampling latch 156 may calculate adjacent addresses using the stored sampling address SADD, and output the calculated adjacent addresses as the target address TADD.

The row control circuit 120 may be coupled to the plurality of memory cells MC of the memory cell region 110 through the plurality of rows WL. The row control circuit 120 may select or activate at least one row selected by the row address RADD when the active command ACT is input and deactivate the activated row when the precharge command PCG is input. In order to select a row to be refreshed during a normal refresh operation, a refresh counter (not shown) for generating a counted address that sequentially increases according to the normal refresh command REF may be additionally provided. The row control circuit 120 may perform a normal refresh operation of sequentially refreshing the plurality of rows WL corresponding to the counted address according to the normal refresh command REF. The row control circuit 120 may perform a target refresh operation of refreshing at least one adjacent row corresponding to the target address TADD according to the refresh management command RFM.

The column control circuit 130 may be coupled to the plurality of memory cells MC of the memory cell region 110 through the plurality of columns BL. The column control circuit 130 may select some columns among the columns BL, according to the column address CADD, read internal data DATA from the memory cells MC through the selected columns according to the read command RD, and write internal data DATA provided through the data input/output circuit 180 to the memory cells MC through the selected columns according to the write command WT. The column control circuit 130 may be coupled to a data pad DQ through the data input/output circuit 180 to transmit and receive data to and from the memory controller.

The data input/output circuit 180 may be coupled between the column control circuit 130 and the data pad DQ to transmit and receive the internal data DATA to and from the memory controller. The data input/output circuit 180 may include a data output circuit 182 and a data input circuit 184. The data output circuit 182 may output the internal data DATA read from the memory cell region 110 to the data pad DQ. The data input circuit 184 may receive the internal data DATA provided from the memory controller through the data pad DQ.

In an embodiment of the present disclosure, each of the row address RADD, the column address CADD, the active count signal ACT_CNT<9:0>, a plurality of random signals RN1<9:0>, RN2<9:0>, and RN3<9:0>, the sampling address SADD, and the target address TADD may be composed of multiple bits.

FIG. 2 is a diagram illustrating the sampling control circuit 154 of FIG. 1, in accordance with an embodiment of the present disclosure.

Referring to FIG. 2, the sampling control circuit 154 may include a random number generation circuit 210, an active counter 220, and a replacement control circuit 230.

The random number generation circuit 210 may generate the plurality of random signals (for example, first to third random signals RN1<9:0>, RN2<9:0>, and RN3<9:0>) according to the refresh management command RFM. The random number generation circuit 210 may change values of the first to third random signals RN1<9:0>, RN2<9:0>, and RN3<9:0> each time the refresh management command RFM is input. The random number generation circuit 210 may be implemented with a pseudo-random number generator (PRNG) based on an exclusive OR-shift (XOR-SHIFT) algorithm. Hereinafter, a case where each random signal is formed of 10 bits will be described as an example. A detailed configuration and operation of the random number generation circuit 210 will be described with reference to FIGS. 3A and 3B.

The active counter 220 may generate the active count signal ACT_CNT<9:0> by counting the number of times of input of the active command ACT during the target refresh period. The active counter 220 may be initialized in response to the refresh management command RFM, and may generate the active count signal ACT_CNT<9:0> having a value that increases by "+1" each time the active command ACT is input. The random number generation circuit 210 and the active counter 220 may generate the first to third random signals RN1<9:0>, RN2<9:0>, and RN3<9:0> and the active count signal ACT_CNT<9:0>, each of which is composed of the same number of bits (e.g., 10-bit). A detailed configuration of the active counter 220 will be described with reference to FIG. 4.

The replacement control circuit 230 may generate the replacement control signal REP_EN by respectively comparing the first to third random signals RN1<9:0>, RN2<9:0>, and RN3<9:0> with the active count signal ACT_CNT<9:0>. The replacement control circuit 230 may detect effective bits of the active count signal ACT_CNT<9:0>, extract some bits of the first to third random signals RN1<9:0>, RN2<9:0>, and RN3<9:0>, respectively, according to the detected effective bits, and generate the replacement control signal REP_EN by respectively comparing the active count signal ACT_CNT<9:0> with the extracted bits from the first to third random signals RN1<9:0>, RN2<9:0>, and RN3<9:0>. Here, the effective bits of the active count signal ACT_CNT<9:0> may be bits which are used to count the number of times of input of the active command ACT. A detailed configuration and operation of the replacement control circuit 230 will be described with reference to FIGS. 5 to 10.

Figure 3A:
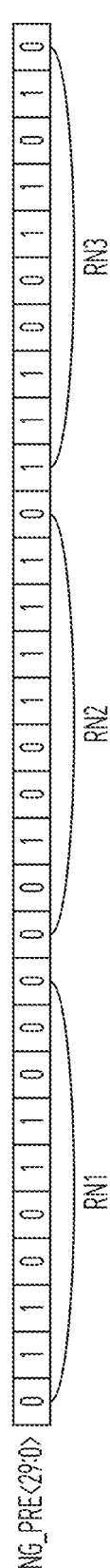
FIGS. 3A and 3B are diagrams for describing a random number generation circuit of FIG. 2, in accordance with an embodiment of the present disclosure.
Figure 3B:
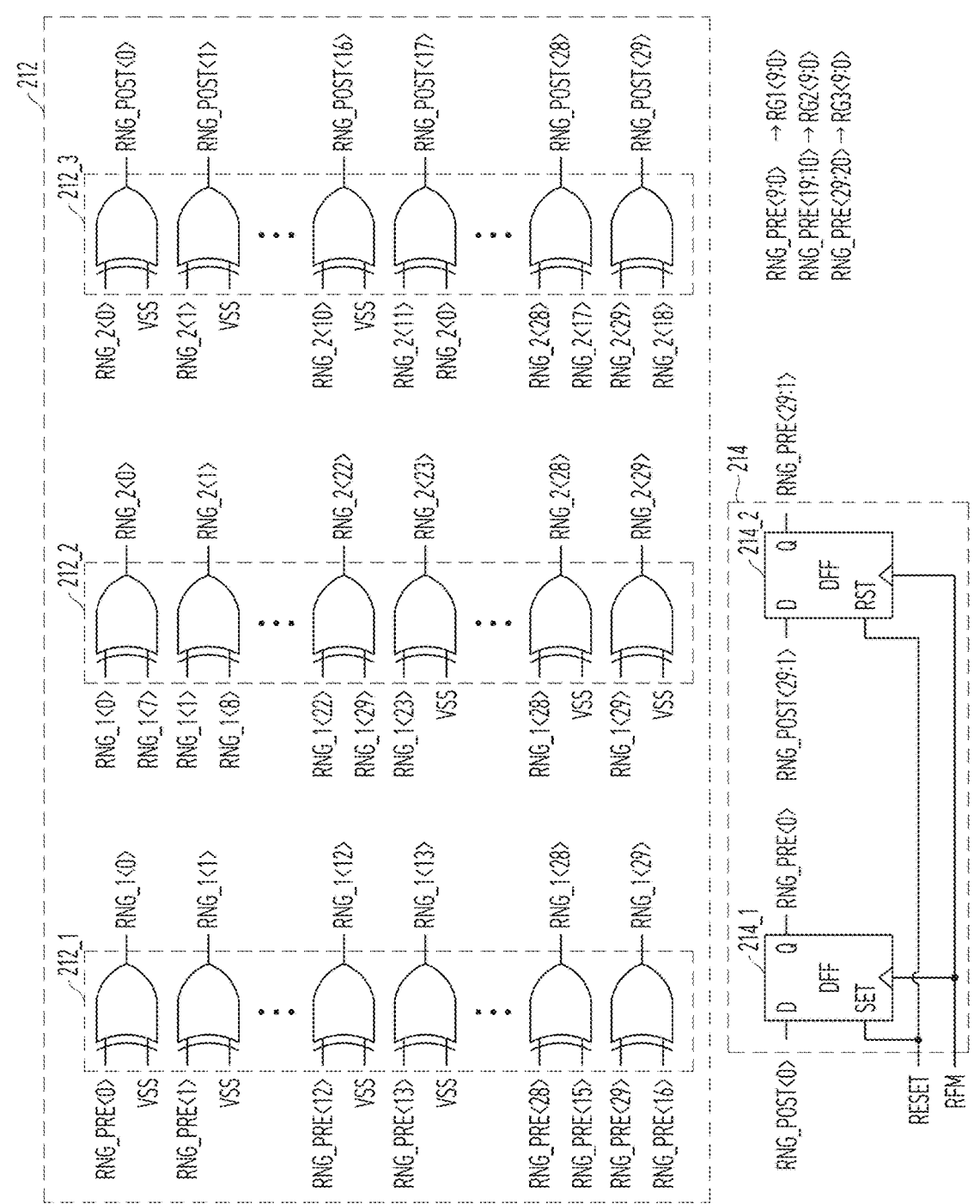

FIGS. 3A and 3B are diagrams for describing the random number generation circuit 210 of FIG. 2, in accordance with an embodiment of the present disclosure.

Referring to FIG. 3A, the random number generation circuit 210 may generate a seed random number consisting of m*n bits, where each of m and n is a positive integer of 2 or more, and may generate n random signals by dividing the seed random number in units of m bits. For example, the random number generation circuit 210 may generate the seed random number RNG_PRE<29:0> consisting of 30 bits (m=10 and n=3), and may generate the first to third random signals RN1<9:0>, RN2<9:0>, and RN3<9:0> by dividing the seed random number RNG_PRE<29:0> by units of 10 bits.

Referring to FIG. 3B, the random number generation circuit 210 may include a preliminary random number generation circuit 212 and an output setting circuit 214.

The preliminary random number generation circuit 212 may generate a preliminary random number RNG-_POST<29:0> by performing one or more logic XORHIFT operations on bits of the seed random number RNG_PRE<29:0>. The logic XORSHIFT operation may include a logic exclusive OR (XOR) operation on an original signal and a bit-shifted signal obtained by shifting some bits of the original signal. In more detail, the preliminary random number generation circuit 212 may include first to third random number generators 212_1 to 212_3.

The first random number generator 212_1 may generate a first intermediate random number RNG_1<29:0> by performing a logic XOR operation on bits of the seed random number RNG_PRE<29:0> and bits obtained by shifting the bits of the seed random number RNG_PRE<29:0>. For example, the first random number generator 212_1 may perform a logic XOR operation on the bits of the seed random number RNG_PRE<29:0> and the bits obtained by shifting the bits of the seed random number RNG_PRE<29:0> 13 times toward a most significant bit (MSB) direction.

The second random number generator 212_2 may generate a second intermediate random number RNG_2<29:0> by performing a logic XOR operation on bits of the first intermediate random number RNG_1<29:0> and bits obtained by shifting the bits of the first intermediate random number RNG_1<29:0>. For example, the second random number generator 212_2 may perform a logic XOR operation on the bits of the first intermediate random number RNG_1<29:0> and bits obtained by shifting the first intermediate random number RNG_1<29:0> 7 times toward a least significant bit (LSB) direction.

The third random number generator 212_3 may generate the preliminary random number RNG_POST<29:0> by performing a logic XOR operation on bits of the second intermediate random number RNG_2<29:0> and bits obtained by shifting the bits of the second intermediate random number RNG_2<29:0>. For example, the third random number generator 212_3 may perform a logic XOR operation on the bits of the second intermediate random number RNG_2<29:0> and the bits obtained by shifting bits of the second intermediate random number RNG_2<29:0> 11 times toward the MSB direction.

The output setting circuit 214 may set at least one of the bits of the seed random number RNG_PRE<29:0> to a high bit during boot-up, and output the preliminary random number RNG_POST<29:0> as the seed random number RNG_PRE<29:0> according to the refresh management command RFM. In more detail, the output setting circuit 214 may include a first flip-flop 214_1 and a second flip-flop 214_2.

The first flip-flop 214_1 may receive at least one bit (e.g., a first bit RNG_POST<0>) of the preliminary random number RNG_POST<29:0> at an input terminal D, and output a corresponding bit (e.g., a first bit RNG_PRE<0>) of the seed random number RNG_PRE<0> at an output terminal Q. The first flip-flop 214_1 may receive the refresh management command RFM at a clock terminal and an initialization signal RESET at a set terminal SET.

The second flip-flop 214_2 may receive the remaining bits (e.g., RNG_POST<29:1>) of the preliminary random number RNG_POST<29:0> at an input terminal D, and output the remaining bits (e.g., RNG_PRE<29:1>) of the seed random number RNG_PRE<29:0> at an output terminal Q. The second flip-flop 214_2 may receive the refresh management command RFM as a clock terminal and the initialization signal RESET at a reset terminal RST. Although FIG. 3B shows that one second flip-flop 214_2 is disposed, the second flip-flop 214_2 may be disposed by a number (i.e., 29) corresponding to bits RNG_PRE<29:1> or RNG_POST<29:1>.

With the above configuration, the output setting circuit 214 may set at least one bit (e.g., the first bit RNG_PRE<0>) among the bits of the seed random number RNG_PRE<29:0> to a high bit during boot-up, and output the preliminary random number RNG_POST<29:0> as the seed random number RNG_PRE<29:0> whenever the refresh management command RFM is input. The bits of the seed random number RNG_PRE<29:0> generated from the output setting circuit 214 may be divided into predetermined bit units (e.g., 10 bits), and may be output as the first to third random signals RN1<9:0>, RN2<9:0>, and RN3<9:0>.

The shifting bits, the number of times of shifting, and the shifting direction used in the preliminary random number generation circuit 212 described in FIG. 3B are only examples, and the embodiments of the present disclosure are not limited thereto. Various types of shifting methods may be applied to the preliminary random number generation circuit 212.

Figure 4:
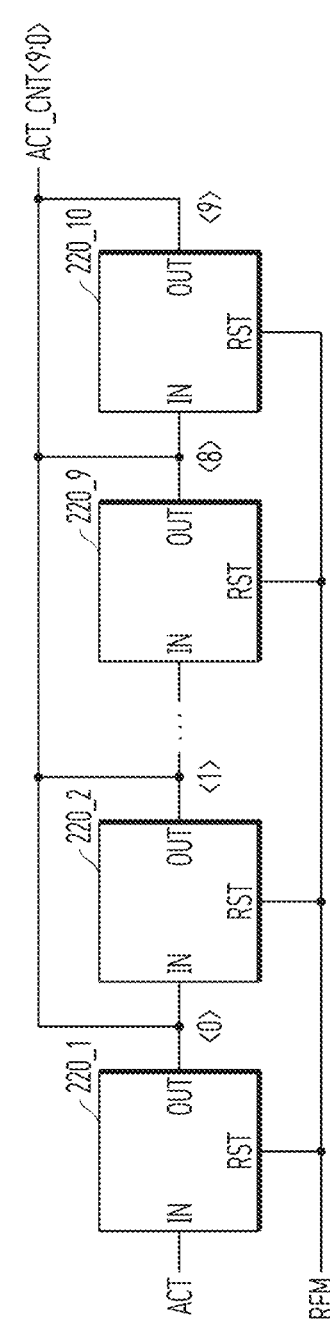
FIG. 4 is a detailed configuration diagram illustrating an active counter of FIG. 2, in accordance with an embodiment of the present disclosure.

FIG. 4 is a detailed configuration diagram illustrating the active counter 220 of FIG. 2, in accordance with an embodiment of the present disclosure.

Referring to FIG. 4, the active counter 220 may include first to tenth unit counters 220_1 to 220_10 coupled in series. Among the first to tenth unit counters 220_1 to 220_10, the first unit counter 220_1 may receive the active command ACT at an input terminal IN, and each of the first to tenth unit counters 220_1 to 220_10 may output a corresponding bit of the active count signal ACT_CNT<9:

8

0> at an output terminal OUT. Each of the first to tenth unit counters 220_1 to 220_10 may receive the refresh management command RFM at a reset terminal RST.

With the above configuration, the active counter 220 may generate the active count signal ACT_CNT<9:0> that is initialized in response to the refresh management command RFM and has a value that increases by "+1" each time the active command ACT is input.

Figure 5:
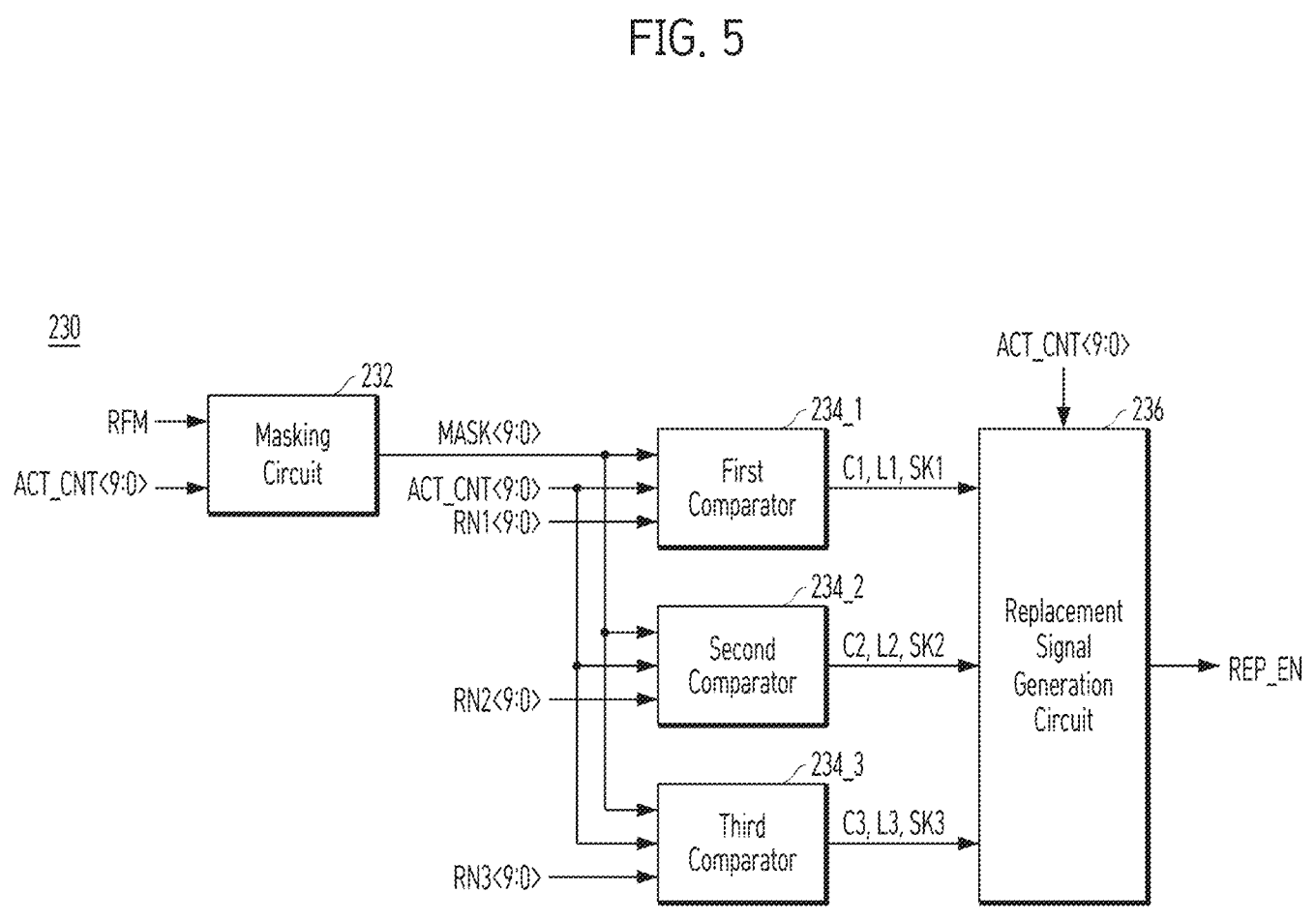

FIG. 5 is a block diagram illustrating the replacement control circuit 230 of FIG. 2, in accordance with an embodiment of the present disclosure.

Referring to FIG. 5, the replacement control circuit 230 may include a masking circuit 232, first to third comparators 234_1 to 234_3, and a replacement signal generation circuit 236.

The masking circuit 232 may generate a masking signal MASK<9:0> according to the effective bits of the active count signal ACT_CNT<9:0> during the target refresh period. The masking signal MASK<9:0> may have bits corresponding to the bits of the active count signal ACT_CNT<9:0>. The masking circuit 232 may reset all bits of the masking signal MASK<9:0> to a low bit when the refresh management command RFM is input, and set each bit of the masking signal MASK<9:0> to a high bit according to activation of the bits of the active count signal ACT_CNT<9:0>. Accordingly, the masking circuit 232 may detect the effective bits (i.e., valid bits) of the active count signal ACT_CNT<9:0>, which are used to count the number of times of input of the active command ACT during the target refresh period, and generate the masking signal MASK<9:0> corresponding to the detected effective bits. A detailed configuration and operation of the masking circuit 232 will be described with reference to FIGS. 6A and 6B.

The first to third comparators 234_1 to 234_3 may compare the active count signal ACT_CNT<9:0> with some bits of the first to third random signals RN1<9:0>, RN2<9: 0>, and RN3<9:0> based on the masking signal MASK<9: 0>, to generate first to third replacement flags C1 to C3, first to third holding flags L1 to L3, and first to third skip flags SK1 to SK3. A detailed configuration and operation of the first to third comparators 234_1 to 234_3 will be described with reference to FIGS. 7 to 9B.

The replacement signal generation circuit 236 may generate the replacement control signal REP_EN according to the first to third replacement flags C1 to C3 and the first to third skip flags SK 1 to SK3. A detailed configuration and operation of the replacement signal generation circuit 236 will be described in FIG. 10.

In FIG. 5, the first to third comparators 234_1 to 234_3 provide the first to third holding flags L1 to L3 to the replacement signal generation circuit 236, but depending on an embodiment, the first to third holding flags L1 to L3 may not be provided to the replacement signal generation circuit 236.

Figure 6A:
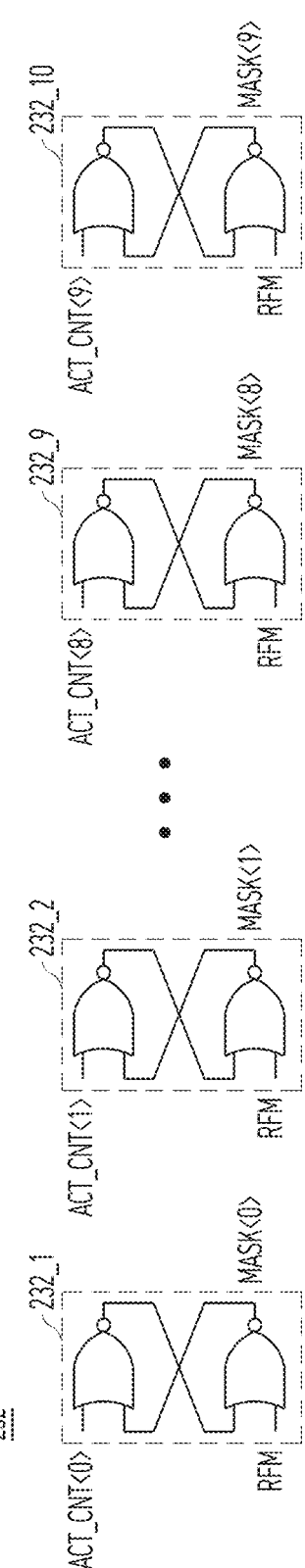
Figure 6B:
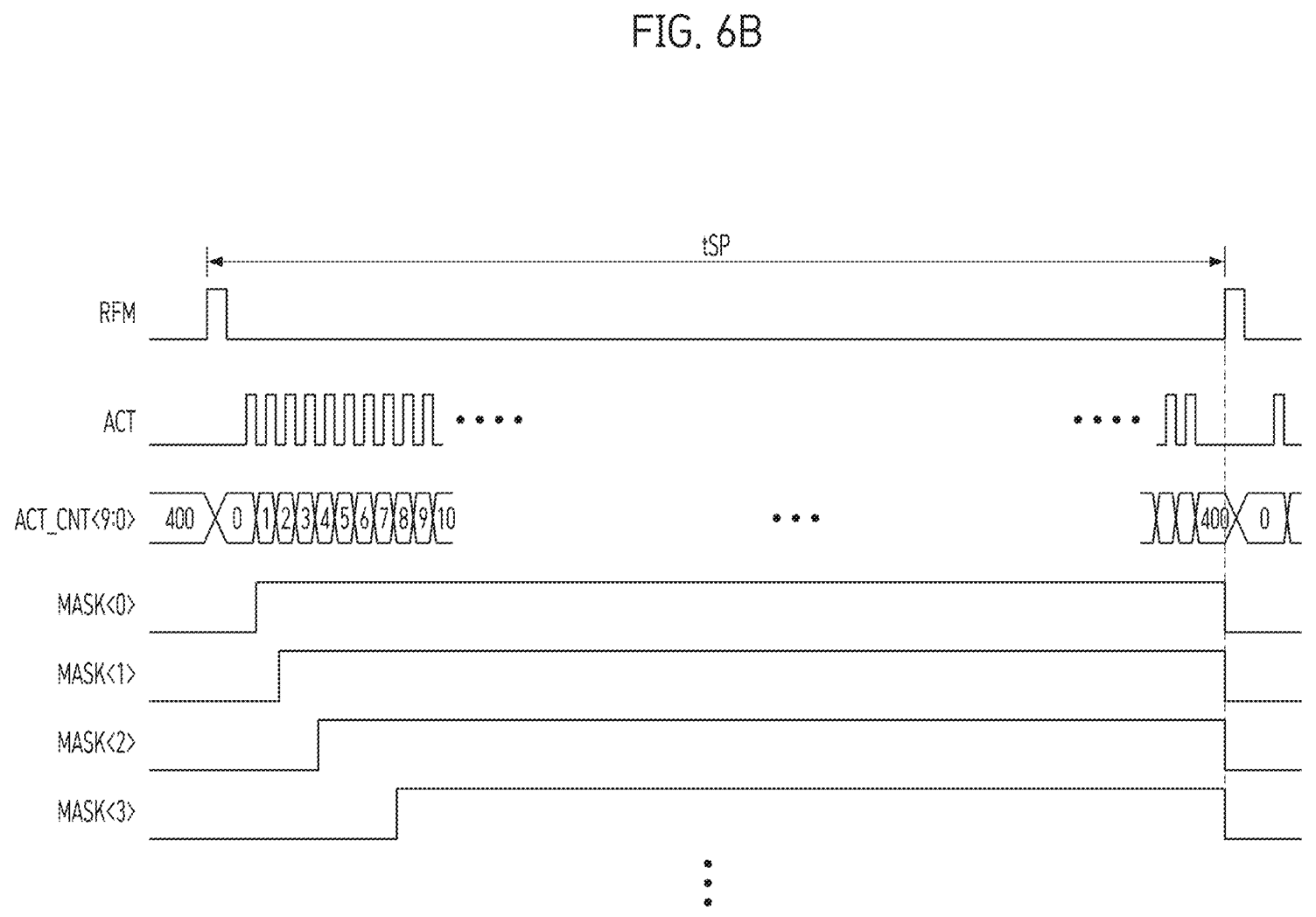

FIG. 6A is a block diagram and FIG. 6B is a timing diagram for describing the masking circuit 232 of FIG. 5, in accordance with an embodiment of the present disclosure.

Referring to FIG. 6A, the masking circuit 232 may include a plurality of SR (set-reset) latches (e.g., first to tenth SR latches 232_1 to 232_10) corresponding to the number of bits of the active count signal ACT_CNT<9:0>. Each of the first to tenth SR latches 232_1 to 232_10 may receive a corresponding bit of the active count signal ACT_CNT<9: 0> as a set signal, and receive the refresh management command RFM as a reset signal, to thereby output a corresponding bit of the masking signal MASK<9:0>.

Referring to FIG. 6B, a section between adjacent refresh management commands RFM may be defined as a target refresh period tSP. The masking circuit 232 may reset all bits of the masking signal MASK<9:0> to a low bit when the refresh management command RFM is input, and set each bit of the masking signal MASK<9:0> to a high bit when a corresponding bit of the active count signal ACT_CNT<9:0> is changed to a high bit from a low bit. For example, when the active command ACT is input 9 times during the target refresh period tSP, the active count signal ACT_CNT<9:0> becomes "00 0000 1001" ("9" in decimal), and thus, the masking signal MASK<9:0> becomes "00 0000 1111" according to the effective bits of the active count signal ACT_CNT<9:0>.

Since the first to third comparators 234_1 to 234_3 have substantially the same configuration, the first comparator 234_1 will be described as an example.

Figure 7:
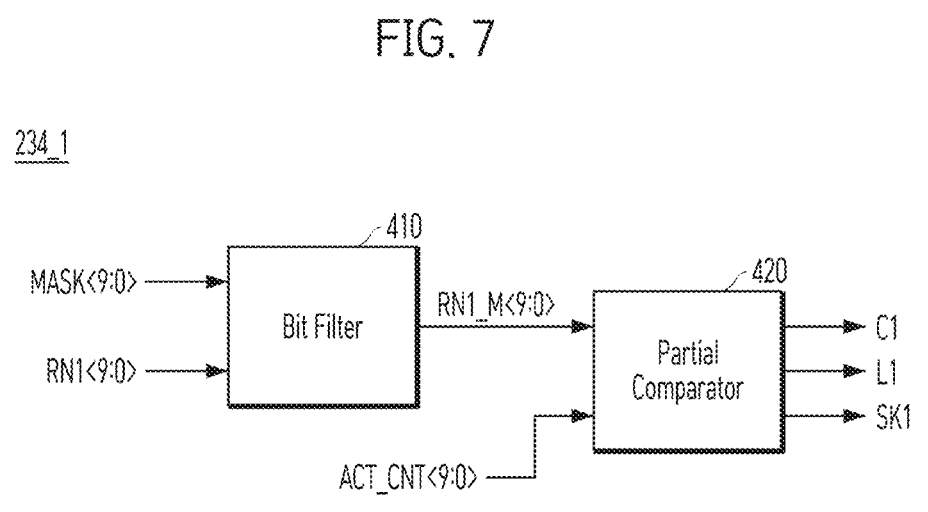

FIG. 7 is a block diagram illustrating the first comparator 234_1 of FIG. 5, in accordance with an embodiment of the present disclosure. FIG. 8 is a flowchart for describing operations of the first comparator 234_1 of FIG. 7.

Referring to FIG. 7, the first comparator 234_1 may include a bit filter 410 and a partial comparator 420.

The bit filter 410 may generate a first extraction signal RN1_M<9:0> by filtering some bits of the first random signal RN1<9:0> according to the masking signal MASK<9:0>. For example, the bit filter 410 may include a plurality of logic AND gates. The bit filter 410 may generate the first extraction signal RN1_M<9:0> by performing a logic AND operation on the masking signal MASK<9:0> and the first random signal RN1<9:0> bit by bit.

The partial comparator 420 may compare the first extraction signal RN1_M<9:0> with the active count signal ACT_CNT<9:0> to generate the first replacement flag C1, the first holding flag L1, and the first skip flag SK1. The partial comparator 420 may activate only one of the first replacement flag C1, the first holding flag L1, and the first skip flag SK1 to a logic high level according to the comparison result.

Referring to FIG. 8, the partial comparator 420 may compare the first extraction signal RN1_M<9:0> with the active count signal ACT_CNT<9:0> (at S110). When the first extraction signal RN1_M<9:0> matches the active count signal ACT_CNT<9:0> (CASE 1 of S110), the partial comparator 420 may activate the first replacement flag C1 to a logic high level (at S120). When the first extraction signal RN1_M<9:0> is smaller than the active count signal ACT_CNT<9:0> (CASE 2 of S110), the partial comparator 420 may activate the first holding flag L1 to a logic high level (at S130). When the first extraction signal RN1_M<9:0> is greater than the active count signal ACT_CNT<9:0> (CASE 3 of S110), the partial comparator 420 may activate the first skip flag SK1 to a logic high level (at S140).

In this case, the active command ACT is input n times and the effective bits of the active count signal ACT_CNT<9:0> are k, the probability that CASE1 occurs may be 1 time from 2^k times, the probability that CASE2 occurs may be (n−1) time from 2^k times, and the probability that CASE3 occurs may be (2^k−n) times from 2^k times. For example, when the active command ACT is input 9 times, and thus, the effective bits of the active count signal ACT_CNT<9:0> are 4, CASE1 may occur 1 time, CASE2 may occur 8 times, and CASE3 may occur 7 times, among 16 times.

FIGS. 9A and 9B are diagrams for describing operations of the first to third comparators 234_1 to 234_3 as examples.

Referring to FIG. 9A, as the active command ACT is input 10 times, the active counter 220 may generate the active count signal ACT_CNT<9:0> of "00 0000 1010", and accordingly, the masking circuit 232 may generate the masking signal MASK<9:0> of "00 0000 1111". In this case, the random number generation circuit 210 generates the first random signal RN1<9:0> of "01 1001 1000", the second random bit RN2<9:0> of "00 1101 1110", and the third random bit RN3<9:0> of "00 0010 1010".

The first comparator 234_1 may generate the first extraction signal RN1_M<9:0> of "00 0000 1000" by performing a logic AND operation on the masking signal MASK<9:0> and the first random signal RN1<9:0>. Referring to FIG. 9B, the first comparator 234_1 may compare the first extraction signal RN1_M<9:0> with the active count signal ACT_CNT<9:0> to activate the first holding flag L1 and deactivate the first replacement flag C1 and the first skip flag SK1 since the first extraction signal RN1_M<9:0> is smaller than the active count signal ACT_CNT<9:0> (CASE 2).

The second comparator 234_2 may generate the second extraction signal RN2_M<9:0> of "00 0000 1110" by performing a logic AND operation on the masking signal MASK<9:0> and the second random signal RN2<9:0>. Referring to FIG. 9B, the second comparator 234_2 may compare the second extraction signal RN2_M<9:0> with the active count signal ACT_CNT<9:0> to activate the second skip flag SK2 and deactivate the second replacement flag C2 and the second holding flag L2 since the second extraction signal RN2_M<9:0> is greater than the active count signal ACT_CNT<9:0> (CASE 3).

The third comparator 234_3 may generate the third extraction signal RN3_M<9:0> of "00 0000 1010" by performing a logic AND operation on the masking signal MASK<9:0> and the third random signal RN3<9:0>. Referring to FIG. 9B, the third comparator 234_3 may compare the third extraction signal RN3_M<9:0> with the active count signal ACT_CNT<9:0> to activate the third replacement flag C3 and deactivate the third hold flag L3 and the third skip flag SK3 since the third extraction signal RN3_M<9:0> matches the active count signal ACT_CNT<9:0> (CASE 1).

As described above, the first to third comparators 234_1 to 234_3 may compare the active count signal ACT_CNT<9:0> with some bits of the first to third random signals RN1<9:0>, RN2<9:0>, and RN3<9:0> based on the masking signal MASK<9:0>, to generate the first to third replacement flags C1 to C3, the first to third holding flags L1 to L3, and first to third skip flags SK1 to SK3.

Figure 10:
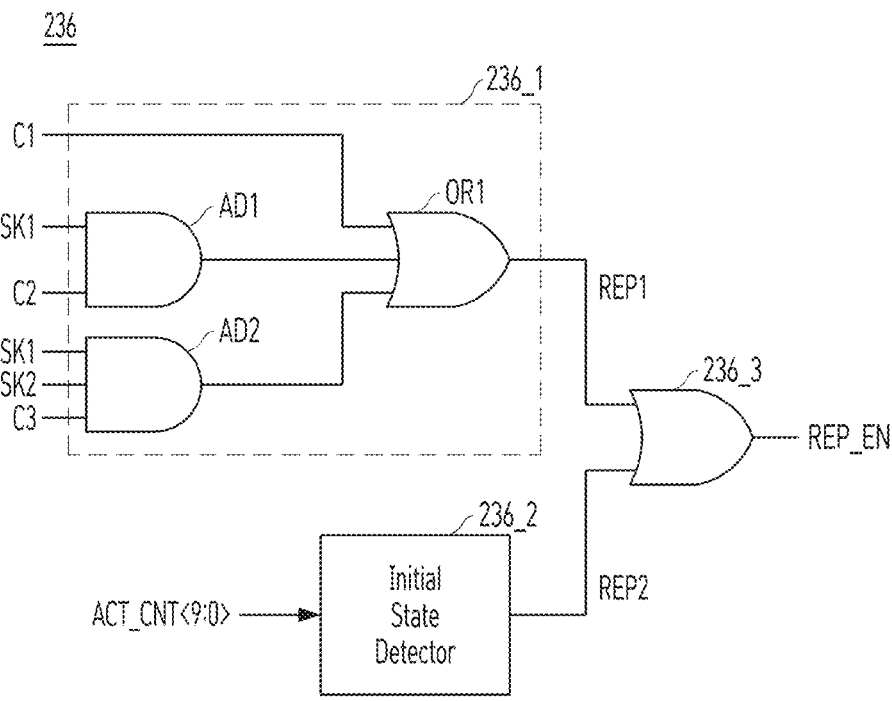
FIG. 10 is a circuit diagram illustrating a replacement signal generation circuit of FIG. 5, in accordance with an embodiment of the present disclosure.

FIG. 10 is a circuit diagram illustrating the replacement signal generation circuit 236 of FIG. 5, in accordance with an embodiment of the present disclosure.

Referring to FIG. 10, the replacement signal generation circuit 236 may include a flag combiner 236_1, an initial state detector 236_2, and an output combiner 236_3.

The flag combiner 236_1 may include first and second AND gates AD1 and AD2 and a first OR gate OR1. The first AND gate AD1 may perform a logic AND operation on the first skip flag SK1 and the second replacement flag C2, and the second AND gate AD2 may perform a logic AND operation on the first skip flag SK1, the second skip flag SK2, and the third replacement flag C3. The first OR gate OR1 may perform a logic OR operation the first replacement flag C1, an output of the first AND gate AD1, and an output of the second AND gate AD2. With the above configuration, the flag combiner 236_1 may activate a first replacement signal REP1 in a case where the first replacement flag C1 is activated, in a case where the second replacement flag C2 is activated in the state in which the first skip flag SK1 is activated, or in a case where the third replacement flag C3 is activated in the state in which both the first skip flag SK1 and the second skip flag SK2 are activated.

The initial state detector 236_2 may activate a second replacement signal REP2 by detecting a case where the active command ACT is first input. For example, the initial state detector 236_2 may detect case where the active count signal ACT_CNT<9:0> is "00 0000 0001" to activate the second replacement signal REP2.

The output combiner 236_3 may output the replacement control signal REP_EN according to the first replacement signal REP1 or the second replacement signal REP2. The output combiner 236_3 may be implemented with a logic OR gate that performs a logic OR operation on the first replacement signal REP1 and the second replacement signal REP2.

Hereinafter, an operation of the replacement control circuit 230 will be described with reference to FIGS. 5 to 11.

Figure 11:
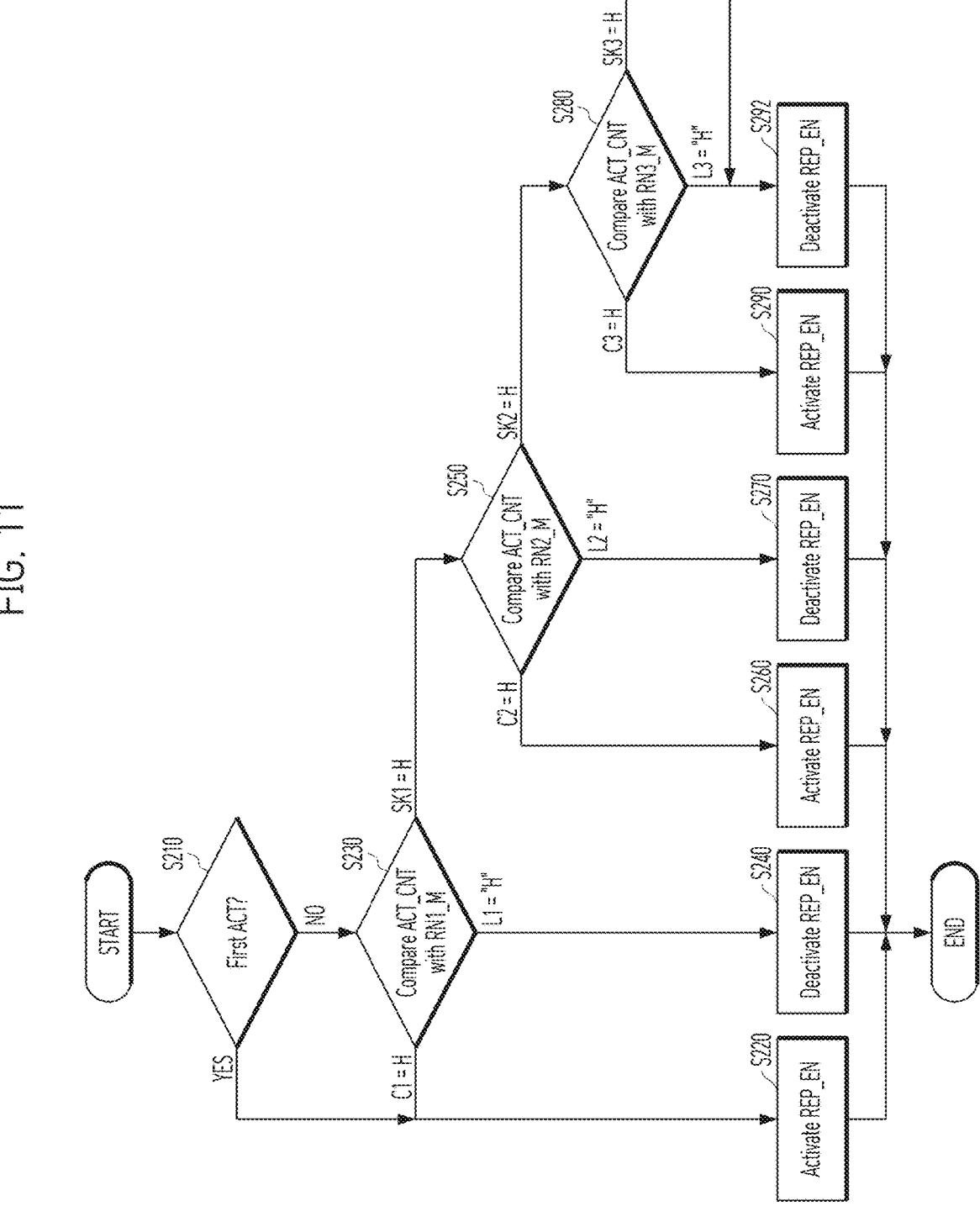
FIG. 11 is a flowchart for describing an operation of the replacement control circuit of FIG. 5.

FIG. 11 is a flowchart for describing an operation of the replacement control circuit 230 of FIG. 5.

Referring to FIG. 11, when the active command ACT is first input ("YES" in S210), the replacement signal generation circuit 236 may activate the replacement control signal REP_EN (at S220).

Whenever the active command ACT is input, the replacement control circuit 230 may generate the mask signal MASK<9:0> according to the effective bits of the active count signal ACT_CNT<9:0>.

First, the first comparator 234_1 may generate the first extraction signal RN1_M<9:0> from the first random signal RN1<9:0> according to the mask signal MASK<9:0>, and compare the active count signal ACT_CNT<9:0> with the first extraction signal RN1_M<9:0> to activate only one of the first replacement flag C1, the first holding flag L1, and the first skip flag SK1 to a logic high level (at S230).

When the first extraction signal RN1_M<9:0> matches the active count signal ACT_CNT<9:0>, the first comparator 234_1 may activate the first replacement flag C1 to a logic high level (C1=H). Accordingly, the replacement signal generation circuit 236 may activate the replacement control signal REP_EN (at S220). In this case, since the first skip flag SK1 is deactivated, flags generated from the second comparator 234_2 and the second comparator 234_2 may be ignored, and an operation may be terminated.

When the first extraction signal RN1_M<9:0> is smaller than the active count signal ACT_CNT<9:0>, the first comparator 234_1 may activate the first holding flag L1 to a logic high level (L1=H). In this case, since the first skip flag SK1 is deactivated, the replacement signal generation circuit 236 may deactivate the replacement control signal REP_EN (at S240), and the operation may be terminated.

On the other hand, when the first extraction signal RN1_M<9:0> is greater than the active count signal ACT_CNT<9:0>, the first comparator 234_1 may activate the first skip flag SK1 to a logic high level (SK1=H).

In the same manner as the first comparator 234_1, the second comparator 234_2 may generate the second replacement flag C2, the second holding flag L2, and the second skip flag SK2 (at S250). In a case where the second comparator 234_2 activates the second replacement flag C2 to a logic high level (C2=H), the replacement signal generation circuit 236 may activate the replacement control signal REP_EN (at S260), and the operation may be terminated. In a case where the second comparator 234_2 activates the second hold flag L2 to a logic high level (L2=H), the replacement signal generation circuit 236 may deactivate the replacement control signal REP_EN (at S270), and the operation may be terminated.

On the other hand, in a case where the second comparator 234_2 may activate the second skip flag SK2 to a logic high level (SK2=H), the replacement signal generation circuit 236 may generate the replacement control signal REP_EN according to the comparison result of the third comparator 234_3.

In the same manner as the first comparator 234_1 and the second comparator 234_2, the third comparator 234_3 may generate the third replacement flag C3, the third hold flag L3, and the third skip flag SK3 (at S280). In a case where the third comparator 234_3 activates the third replacement flag C3 to a logic high level (C3=H), the replacement signal generation circuit 236 may activate the replacement control signal REP_EN (at S290). In a case where the third comparator 234_3 activates the third hold flag L3 or the third skip signal SK3 (L3=H, SK=H), the replacement signal generation circuit 236 may deactivate the replacement control signal REP_EN (at S292).

In FIG. 8, when the active command ACT is input n times and the effective bits of the active count signal ACT_CNT<9:0> are k, in each comparator, the probability that CASE1 occurs may be 1 time from $2^{\wedge}k$ times, the probability that CASE2 occurs may be (n−1) times from $2^{\wedge}k$ times, and the probability that CASE3 issues may be $(2^{\wedge}k−n)$ times from $2^{\wedge}k$ times. As described in FIG. 11, in an embodiment of the present disclosure, the replacement control circuit 230 determines whether or not to be replaced according to a ratio between CASE1 and CASE2, and thus a maintenance/replacement ratio of the sampling address SADD stored in the sampling latch 156 may be determined as (n−1):1. Accordingly, the replacement of the sampling address SADD may be determined with a 1/n probability. Accordingly, the embodiments of the present disclosure can improve the efficiency of the target refresh operation by variably responding to the row-hammer situation in which the number of active commands applied during the target refresh period is not constant. For reference, the probability that the decision of maintenance or replacement is postponed (i.e., CASE3) in each comparator becomes $(2^{\wedge}k−n)/2^{\wedge}k$, and is always less than ½. Accordingly, as the number of comparators increases, the address may be sampled at a more precisely uniform probability.

Figure 12:
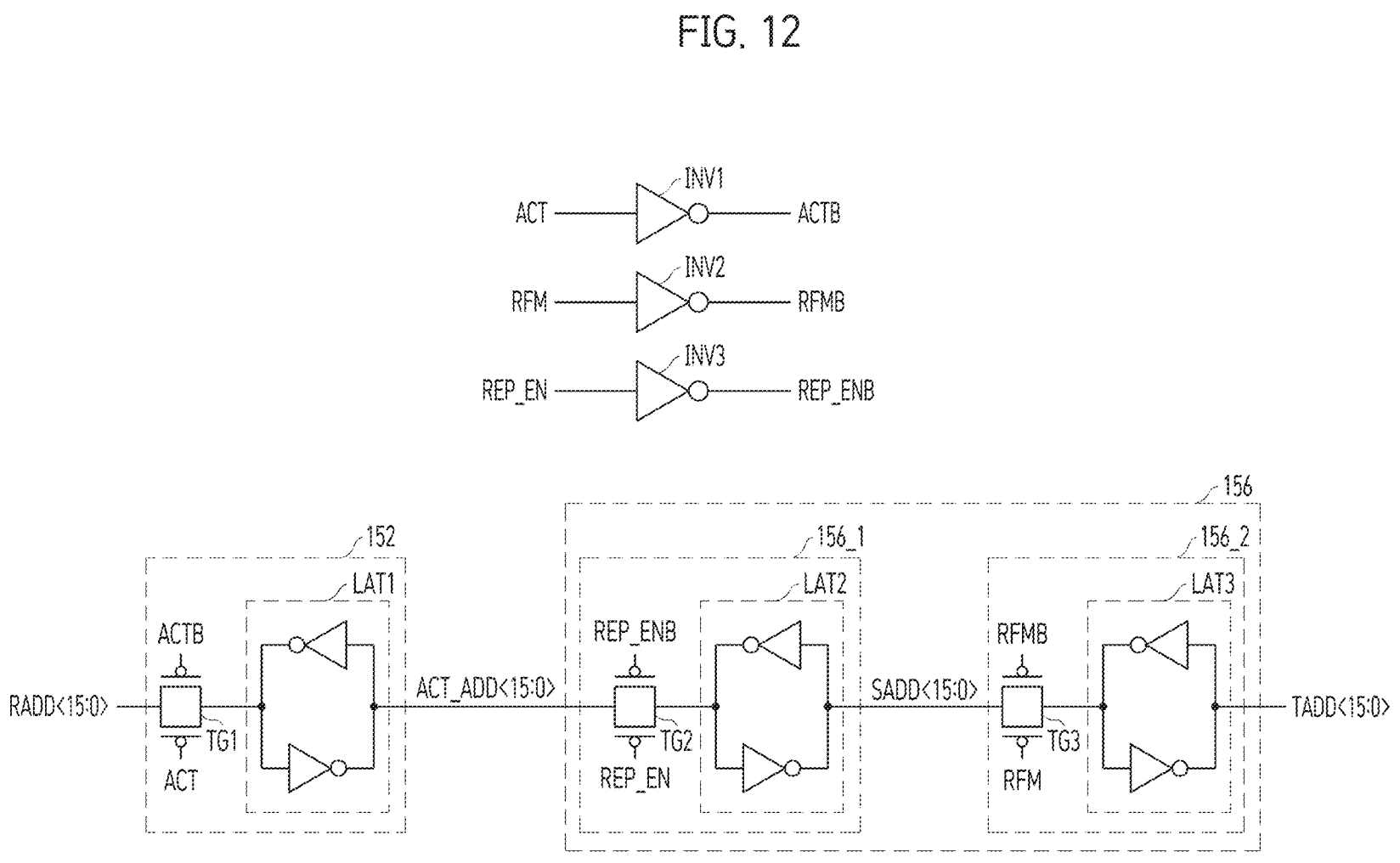

FIG. 12 is a circuit diagram illustrating the active latch 152 and the sampling latch 156 of FIG. 1, in accordance with an embodiment of the present disclosure.

Referring to FIG. 12, the active latch 152 may include a first transmission gate TG1 and a first latch LAT1. The first transmission gate TG1 may transmit the row address RADD<15:0> to the first latch LAT1 according to the active command ACT. The first latch LAT1 may store the transmitted row address RADD<15:0> as the active address ACT_ADD<15:0>.

The sampling latch 156 may include an input circuit 156_1 and an output circuit 156_2.

The input circuit 156_1 may receive and store the active address ACT_ADD<15:0> as the sampling address SADD<15:0> according to the replacement control signal REP_EN. The output circuit 156_2 may output the sampling address SADD<15:0> as the target address TADD<15:0> according to the refresh management command RFM.

In detail, the input circuit 156_1 may include an input transmission gate TG2 and an input latch LAT2. The input transmission gate TG2 may transmit the active address ACT_ADD<15:0> to the input latch LAT2 according to the replacement control signal REP_EN. The input latch LAT2 may store the transmitted active address ACT_ADD<15:0> as the sampling address SADD<15:0>.

The output circuit 156_2 may include an output transmission gate TG3 and an output latch LAT3. The output transmission gate TG3 may transmit the sampling address SADD<15:0> to the output latch LAT3 according to the refresh management command RFM. The output latch LAT3 may store the transmitted sampling address SADD<15:0> as the target address TADD<15:0>.

The first transmission gate TG1 and the first latch LAT1 of the active latch 152, and the input circuit 156_1 and the output circuit 156_2 of the sampling latch 156 may be arranged as many (e.g., 16) as the numbers corresponding to the bits of the address. Also, first to third inverters INV1 to INV3 may be additionally disposed to invert the active command ACT, the refresh management command RFM, and the replacement control signal REP_EN, respectively, to generate inverted signals ACTB, RFMB, and REP_ENB thereof. The first transmission unit TG1 may be turned on according to the active command ACT and an output of the first inverter INV1, the input transmission unit TG2 may be turned on according to the replacement control signal REP_EN and an output of the third inverter INV3, and the output transmission unit TG3 may be turned on according to the refresh management command RFM and an output of the second inverter INV2.

In the above embodiment, the case where the memory device 100 performs the target refresh operation according to the refresh management command RFM provided from the external device (e.g., a memory controller) has been described as an example, but the memory device 100 may further perform a target refresh operation by generating a target refresh command TREF internally according to the normal refresh command REF.

Figure 13:
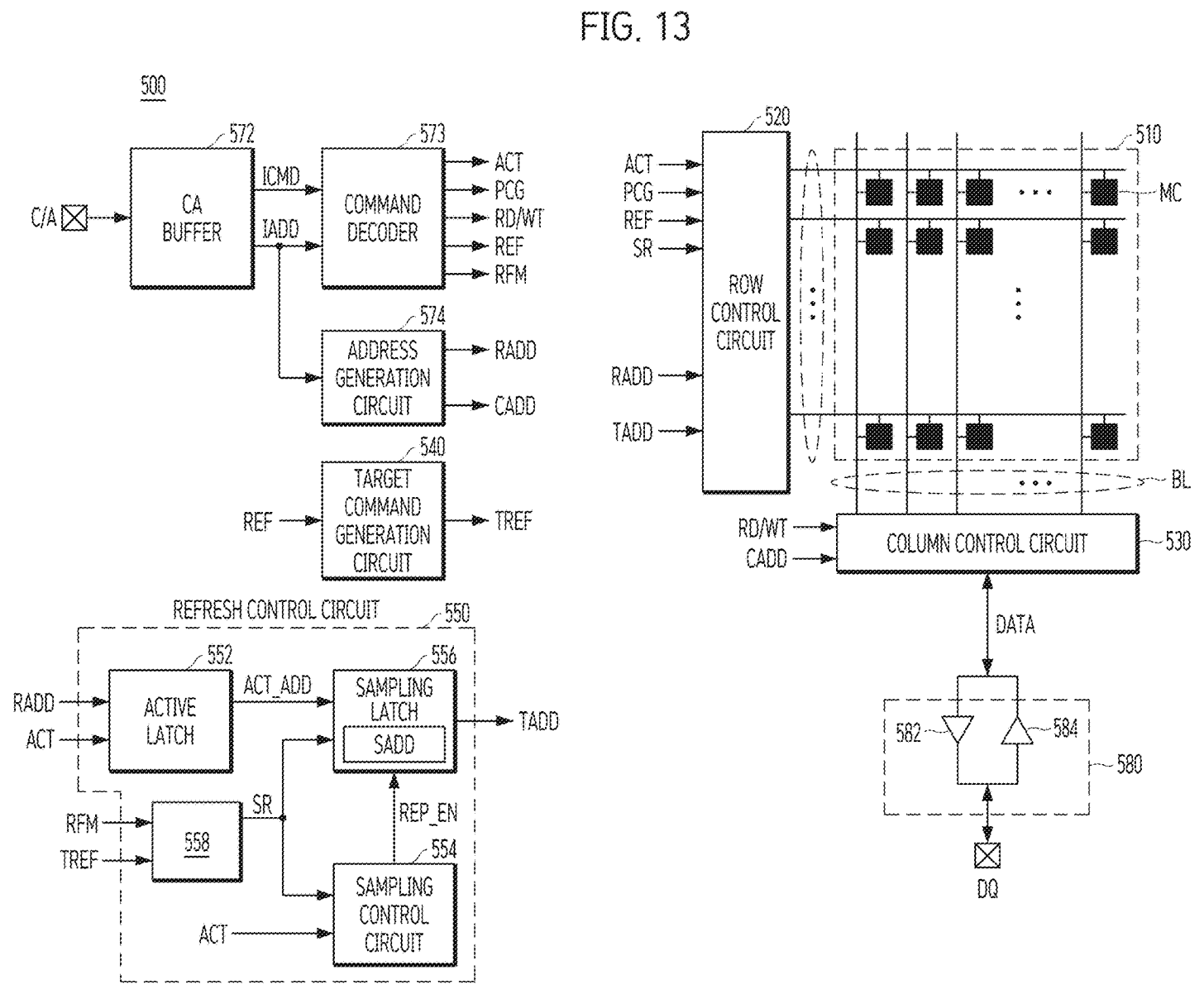

FIG. 13 is a block diagram illustrating a memory device 500 according to another embodiment of the present disclosure.

Referring to FIG. 13, the memory device 500 may include a memory cell region 510, a row control circuit 520, a column control circuit 530, a target command generation circuit 540, a refresh control circuit 550, a command/address (CA) buffer 572, a command decoder 573, an address generation circuit 574, and a data input/output circuit 580. The memory cell region 510, the column control circuit 530, the CA buffer 572, the command decoder 573, the address generation circuit 574, and the data input/output circuit 580 may have substantially the same configuration as the configurations of FIG. 1.

The target command generation circuit 540 may generate a target refresh command TREF based on a normal refresh command REF. For example, the target command generation circuit 540 may generate the target refresh command TREF whenever the number of times of input of the normal refresh command REF reaches a preset number or a preset condition. In the present embodiment, a target refresh period may be determined by a refresh management command RFM or the target refresh command TREF, and one target refresh period may be defined as a period between adjacent commands of the refresh management command RFM and the target refresh command TREF.

The row control circuit 520 may be coupled to a plurality of memory cells MC of the memory cell region 510 through a plurality of rows WL. The row control circuit 520 may activate the row WL corresponding to the row address RADD according to an active command ACT, and may precharge the activated row WL according to a precharge command PCG. The row control circuit 520 may perform a normal refresh operation for sequentially refreshing the plurality of rows WL according to the normal refresh command REF. The row control circuit 520 may perform a target refresh operation for refreshing at least one adjacent row corresponding to the target address TADD according to the target refresh command TREF or the refresh management command RFM.

The refresh control circuit 550 may latch the row address RADD as an active address ACT_ADD according to the active command ACT, and store the active address ACT_ADD as a sampling address SADD according to a replacement control signal REP_EN. The refresh control circuit 550 may output the sampling address SADD as the target address TADD according to the target refresh command TREF or the refresh management command RFM.

In detail, the refresh control circuit 550 may include an active latch 552, a sampling control circuit 554, and a sampling latch 556. The active latch 552, the sampling control circuit 554, and the sampling latch 556 of FIG. 13 may have substantially the same configuration as the configurations of FIG. 1. However, the refresh control circuit 550 of FIG. 13 may further include a logic circuit 558 that generates a target refresh signal SR by performing a logic OR operation on the target refresh command TREF and the refresh management command RFM. The target refresh signal SR may be provided to the sampling control circuit 554 and the sampling latch 556, respectively.

With the above configuration, the memory device 500 may latch the row address RADD according to the active command ACT to generate the active address ACT_ADD, and generate an active count signal by counting the number of times the active command ACT is input during the target refresh period. The memory device 500 may generate the replacement control signal REP_EN by respectively comparing the active count signal with a plurality of random signals, replace the sampling address SADD with the active address ACT_ADD according to the replacement control signal REP_EN, and output the sampling address SADD as the target address TADD according to the target refresh signal SR. The memory device 500 may refresh at least one adjacent row corresponding to the target address TADD according to the target refresh signal SR.

Figure 14:
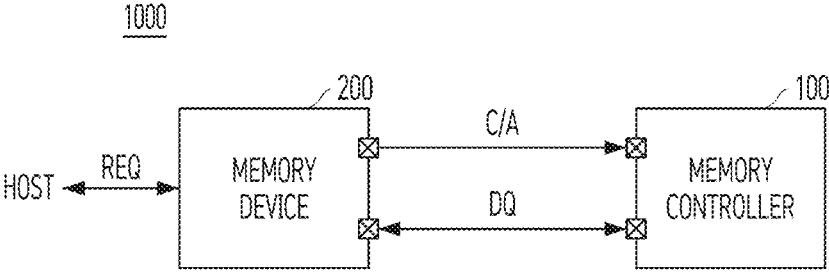
FIG. 14 is a block diagram illustrating a memory system according to an embodiment of the present disclosure.

FIG. 14 is a block diagram illustrating a memory system 1000 according to an embodiment of the present disclosure.

Referring to FIG. 14, the memory system 1000 include a memory device 100 and a memory controller 200.

The memory controller 200 may control an overall operation of the memory system 1000 and control an overall data communication between a host (i.e., an external device) and the memory device 100. The memory controller 200 may generate a command/address signal (C/A) in response to a request REQ from the host and provide it to the memory device 100. According to an embodiment, the memory controller 200 may provide a clock to the memory device 100 together with the command/address signal C/A. The memory controller 200 may provide data corresponding to the request REQ provided from the host to the memory device 100. The memory controller 200 may provide the data read from the memory device 100 to the host.

The command/address signal C/A provided from the memory controller 200 to the memory device 100 may include an active command ACT, a precharge command PCG, a normal refresh command REF, a refresh management command RFM, a read command RD, and a write command WT. The memory controller 200 may apply the normal refresh command REF indicating a normal refresh operation between operations requested by the host. The memory controller 200 may apply the normal refresh command REF so that all rows are normally refreshed within a refresh window (i.e., tREFW) defined in a specification. In addition, the memory controller 200 may issue the refresh management command RFM at each time interval defined in the specification, or whenever the number of issuances of active commands ACT reaches a number of times defined in the specification.

The memory device 100 may have substantially the same configuration as the memory device 100 of FIG. 1 or the memory device 500 of FIG. 13. That is, in an embodiment of the present disclosure, the memory device 100 may generate a target refresh command TREF that defines a target refresh period according to the normal refresh command REF. The memory device 100 may generate an active address by latching an address input according to the active command ACT, and may generate an active count signal by counting the number of times the active command ACT is input during the target refresh period. The memory device 100 may generate a replacement control signal by respectively comparing an active count signal with a plurality of random signals, replace a sampling address with the active address according to the replacement control signal, and output the sampling address as a target address according to the refresh management command RFM. The memory device 100 may refresh at least one adjacent row corresponding to the target address according to the refresh management command RFM. Accordingly, according to an embodiment of the present invention, even if the number of active commands ACT applied during the target refresh period is not constant, the memory system 1000 may variably respond to the row-hammer situation by determining the replacement of the sampling address with a 1/N probability when the active command ACT is input N times.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made based on the technological scope of the present disclosure in addition to the embodiments disclosed herein. The embodiments may be combined to form additional embodiments.

It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the present disclosure and the following claims.

For example, for the logic gates and transistors provided as examples in the above-described embodiments, different positions and types may be implemented depending on the polarity of the input signal.

What is claimed is:

1. A semiconductor device comprising:
   a random number generation circuit configured to generate a plurality of random signals according to a sampling signal;
   an active counter configured to count a number of inputs of an active command during a sampling period defined by the sampling signal to generate an active count signal;
   a replacement control circuit configured to compare the active count signal with each of the plurality of random signals to generate a replacement control signal; and a sampling latch configured to replace a sampling address with an input address according to the replacement control signal, and output the sampling address according to the sampling signal.

2. The semiconductor device of claim 1, wherein the random number generation circuit is configured to generate a seed random number consisting of m*n bits according to the sampling signal, and generate n random signals by dividing the seed random number in units of m bits, where each of m and n is a positive integer of 2 or more.

3. The semiconductor device of claim 1,
   wherein the random number generation circuit includes:
      a preliminary random number generation circuit configured to perform one or more logic exclusive OR-shift (XORSHIFT) operations on a seed random number to generate a preliminary random number; and
      an output setting circuit configured to set at least one of bits of the seed random number to a high bit during boot-up, and output the preliminary random number as the seed random number according to the sampling signal, and
   wherein the bits of the seed random number are divided into predetermined bit units to be output as the plurality of random signals.

4. The semiconductor device of claim 3, wherein the preliminary random number generation circuit includes:
   a first random number generator configured to generate a first intermediate random number by performing a logic exclusive OR (XOR) operation on bits of the seed random number and bits obtained by shifting the bits of the seed random number;
   a second random number generator configured to generate a second intermediate random number by performing a logic XOR operation on bits of the first intermediate random number and bits obtained by shifting the bits of the first intermediate random number; and
   a third random number generator configured to generate the preliminary random number by performing a logic XOR operation on bits of the second intermediate random number and bits obtained by shifting the bits of the second intermediate random number.

5. The semiconductor device of claim 1, wherein the replacement control circuit is configured to:
   detect effective bits of the active count signal during the sampling period,
   extract some bits of each of the plurality of random signals according to the detected effective bits, and
   generate the replacement control signal by comparing the active count signal with the extracted bits from each of the first to third random signals.

6. The semiconductor device of claim 1, wherein the replacement control circuit includes:
   a masking circuit configured to generate a masking signal according to effective bits of the active count signal during the sampling period;
   a plurality of comparators configured to compare the active count signal with some bits of each of the plurality of random signals based on the masking signal to generate a plurality of replacement flags and a plurality of skip flags; and
   a replacement signal generation circuit configured to generate the replacement control signal according to the plurality of replacement flags and the plurality of skip flags.

7. The semiconductor device of claim 6, wherein the masking circuit includes a plurality of set-reset (SR) latches, each of which receives each bit of the active count signal as a set signal, receives the sampling signal as a reset signal, and generates each bit of the masking signal.

8. The semiconductor device of claim 7, wherein each of the plurality of comparators includes:

a bit filter configured to filter some bits of a corresponding random signal according to the masking signal to generate an extraction signal; and a partial comparator configured to compare the extraction signal with the active count signal to generate a corresponding replacement flag and a corresponding skip flag.

9. The semiconductor device of claim 8, wherein the partial comparator is configured to:

activate the replacement flag when the extraction signal matches the active count signal; and activate the skip flag when the extraction signal is greater than the active count signal.

10. The semiconductor device of claim 6, wherein replacement signal generation circuit includes:

a flag combiner configured to activate a first replacement signal in a case where a first replacement flag among the plurality of replacement flags is activated, or in a case where a replacement flag at a current stage is activated in a state in which all skip flags at previous stages are activated;

an initial state detector configured to detect a case where the active command is first input to activate a second replacement signal; and an output combiner configured to generate the replacement control signal according to the first replacement signal or the second replacement signal.

11. The semiconductor device of claim 1, wherein the sampling latch includes:

an input circuit configured to receive and store the input address as the sampling address according to the replacement control signal; and an output circuit configured to output the sampling address according to the sampling signal.

12. A memory device comprising:

a plurality of rows;

a sampling control circuit configured to count a number of inputs of an active command during a target refresh period defined by a target refresh signal to generate an active count signal, and compare the active count signal with each of a plurality of random signals to generate a replacement control signal;

a sampling latch configured to replace a sampling address with an active address according to the replacement control signal, and output the sampling address as a target address according to the target refresh signal; and a row control circuit configured to refresh at least one row corresponding to the target address, among the plurality of rows, according to the target refresh signal.

13. The memory device of claim 12, wherein the sampling control circuit includes:

a random number generating circuit configured to generate a seed random number consisting of m*n bits according to the target refresh signal, perform one or more logic exclusive OR-shift (XORSHIFT) operations on the seed random number, and generate n random signals by dividing the seed random number in units of m bits, where each of m and n is a positive integer of 2 or more.

14. The memory device of claim 12, wherein the sampling control circuit includes:

a masking circuit configured to generate a masking signal according to effective bits of the active count signal during the target refresh period;

a plurality of comparators configured to compare the active count signal with some bits of each of the plurality of random signals based on the masking signal to generate a plurality of replacement flags and a plurality of skip flags; and a replacement signal generation circuit configured to generate the replacement control signal according to the plurality of replacement flags and the plurality of skip flags.

15. The memory device of claim 14, wherein each of the plurality of comparators includes:

a bit filter configured to filter some bits of a corresponding random signal according to the masking signal to generate an extraction signal; and a partial comparator configured to compare the extraction signal with the active count signal to generate a corresponding replacement flag and a corresponding skip flag.

16. The memory device of claim 14, wherein the replacement signal generation circuit includes:

a flag combiner configured to activate a first replacement signal in a case where a first replacement flag among the plurality of replacement flags is activated, or in a case where a replacement flag at a current stage is activated in a state in which all skip flags at previous stages are activated;

an initial state detector configured to detecting a case where the active command is first input to activate a second replacement signal; and an output combiner configured to generate the replacement control signal according to the first replacement signal or the second replacement signal.

17. The memory device of claim 12, further comprising:

a target command generation circuit configured to generate a target refresh command based on a normal refresh command provided from a memory controller.

18. The memory device of claim 12, further comprising:

an active latch configured to latch an input address according to the active command to generate the active address.

19. The memory device of claim 17, further comprising:

a logic circuit configured to perform a logic OR operation on a refresh management command provided from the memory controller and the target refresh command to generate the target refresh signal.

20. The memory device of claim 18, wherein the sampling latch includes:

an input circuit configured to receive and store the active address as the sampling address according to the replacement control signal; and an output circuit configured to output the sampling address according to the target refresh signal.

* * * * *